United States Patent [19]
Garcia et al.

[11] Patent Number: 5,963,012
[45] Date of Patent: Oct. 5, 1999

[54] WIRELESS BATTERY CHARGING SYSTEM HAVING ADAPTIVE PARAMETER SENSING

[75] Inventors: Jorge L. Garcia, Plantation; Annamarie Burke, Coral Springs; Juan B. De La Luz, Miami; Charles B. Swope, Coral Springs; Joseph Patino, Pembroke Pines, all of Fla.

[73] Assignee: Motorola, Inc., Schaumburg, Ill.

[21] Appl. No.: 09/113,023

[22] Filed: Jul. 13, 1998

[51] Int. Cl.⁶ .................................................. H01M 10/46
[52] U.S. Cl. ........................................... 320/106; 320/108
[58] Field of Search ................................... 320/106, 108, 320/110, 112, 113; 429/90

[56] References Cited

U.S. PATENT DOCUMENTS

| | | | |
|---|---|---|---|
| 4,031,449 | 6/1977 | Trombly | 320/108 |
| 5,111,128 | 5/1992 | Branan, Jr. et al. | 320/106 |
| 5,206,097 | 4/1993 | Burns et al. | 320/114 X |
| 5,298,346 | 3/1994 | Gyenes | 429/90 |
| 5,381,137 | 1/1995 | Ghaem et al. | 340/572 |
| 5,596,567 | 1/1997 | deMuro et al. | |
| 5,602,919 | 2/1997 | Hurta et al. | 380/24 |
| 5,675,627 | 10/1997 | Yaker | 379/57 |
| 5,689,825 | 11/1997 | Averbuch et al. | 455/89 |
| 5,717,314 | 2/1998 | Wakefield | |

*Primary Examiner*—Edward H. Tso
*Attorney, Agent, or Firm*—Barbara R. Doutre

[57] ABSTRACT

A battery pack (304) and battery charging system (300, 400) provides contactless dynamic battery parameter sensing. A proximity sensor (208) is located in the battery pack (304) to monitor battery parameter measurements taken by battery parameter sensors (206). These battery parameter measurements are transferred to a charger (302) or radio (404) through a wireless link established between an excitation circuit, proximity sensor, and reader. The dynamically measured battery parameter information allows a charger (302) or radio (404) to select or adapt a charging routine based on the battery measurements. The use of a proximity sensor (208) along with battery parameter sensors (206) allow for minimal interface contacts between the radio and charger as well as the radio and battery.

15 Claims, 4 Drawing Sheets

WIRELESS BATTERY CHARGING SYSTEM HAVING ADAPTIVE PARAMETER SENSING

TECHNICAL FIELD

This invention relates to battery charging systems, and more particularly to wireless battery charging systems.

BACKGROUND

Portable communications products, such as radios, are often powered off of rechargeable batteries. A battery can be charged based on a variety of parameters such as voltage, battery chemistry, rated capacity, and temperature for a particular battery. While positive and negative charge terminals are used for charging the battery and measuring the battery cell voltage, many batteries also include additional contacts for monitoring such parameters as temperature, rated battery capacity and chemistry type. Furthermore, the battery usually includes another set of separate positive and negative power contacts to interface the battery to the radio. The use of multiple contacts adds not only to the cost of the battery and charger but is often a source of intermittence due to misalignment and/or contact contamination.

Manufacturers of battery chargers have realized that the chargers can be made less sophisticated and less expensive if the battery provides some indication of how it should be recharged. One way for transferring battery information to the charger with fewer contacts is to produce a battery with a memory device. The memory device contains charge instructions and other recharge related data, such as rated capacity and chemistry. When the battery is coupled to the charger, the charger retrieves the information from the battery's memory and charges the battery accordingly. However, certain cell parameters, such as temperature, pressure, and voltage, are dynamic in that they can vary throughout the charge cycle and therefore do not lend themselves to being stored as a parameter in memory.

Accordingly, there is a need for an improved battery pack and charge system which can effectively monitor battery parameters including those parameters with dynamic characteristics while eliminating the need for separate contacts. It would be a further benefit to minimize the overall use of interface contacts in battery-to-charger systems and/or battery-to-radio systems where possible.

DETAILED DESCRIPTION OF THE PREFERRED EMBODIMENT

Figure 1:
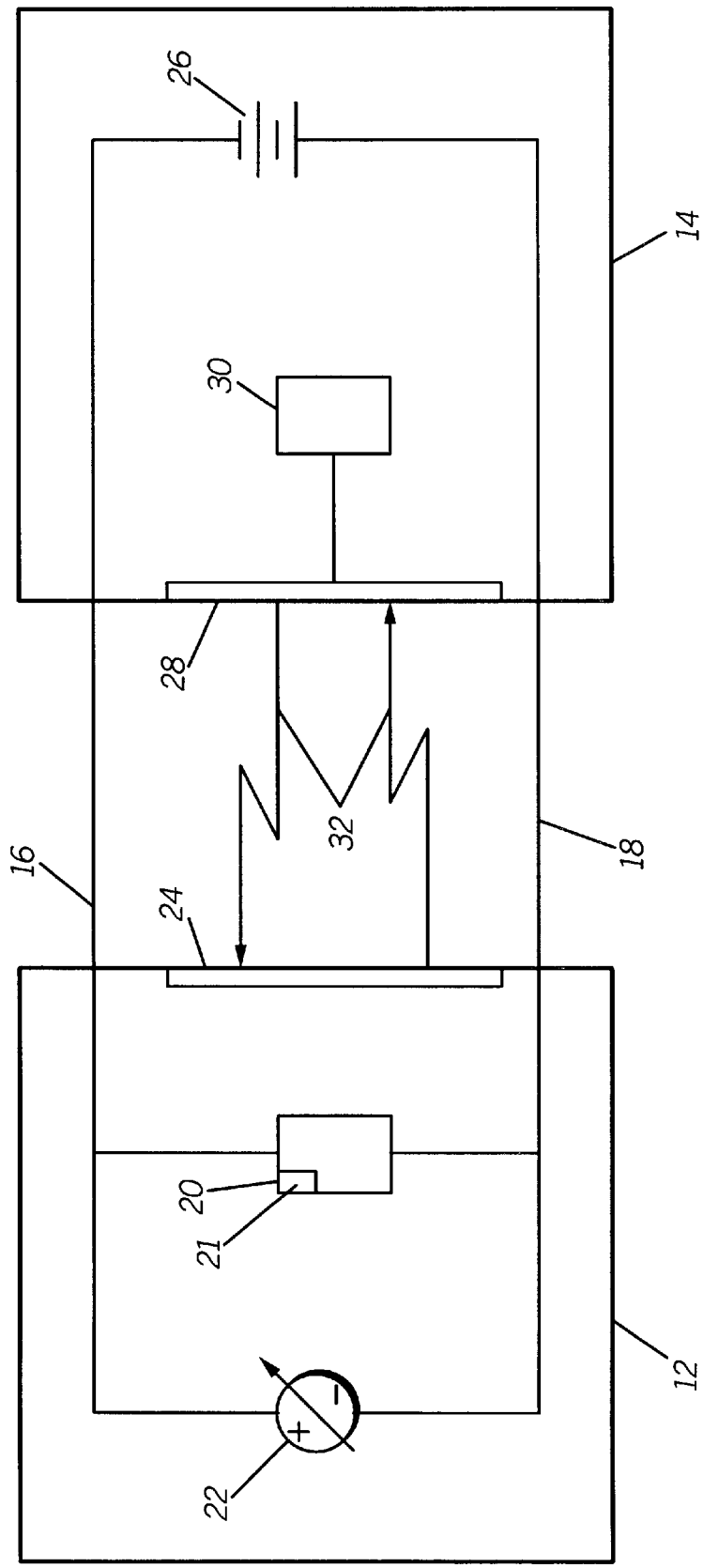
FIG. 1 is a prior art battery charging system.

While the specification concludes with claims defining the features of the invention that are regarded as novel, it is believed that the invention will be better understood from a consideration of the following description in conjunction with the drawing figures, in which like reference numerals are carried forward.

One means of transferring charging information from a battery to a charger is through the use of a wireless charging system as described in U.S. Pat. No. 5,596,567 entitled "Wireless Battery Charging System" by deMuro et al. which is assigned to Motorola, Inc. and which is hereby incorporated by reference. FIG. 1 of the incorporated reference shows a battery charging system 10 including a battery charger 12 and battery pack 14 which communicate over a wireless channel 32 when the battery pack is proximally coupled to the charger. The operation of the wireless charging system 10 is described in the incorporated patent but briefly, while the battery charger 12 sits idle, a wireless communications module 24 continuously interrogates the wireless channel 32 to determine if a battery pack 14 is proximally located to the charger. When the battery pack 14 is brought next to the battery charger 12 through a small distance, a communication link is established over the wireless channel 32. The battery charger 12 then commences a recharge process in accordance with the information received from the battery's memory holding device 30.

As previously discussed, the dynamic battery parameters of temperature, pressure, and voltage have thus far still required the use of separate contacts in prior art charging systems. The battery pack and charging apparatus to be described herein provide an extension to the above referenced patent in that they provide dynamic contactless battery parameter sensing capability so that the charger can adaptively modify its charging routine to the varying parameters of the battery. This dynamic contactless measurement eliminates contact reliability problems and thus improves charging reliability.

Figure 2:
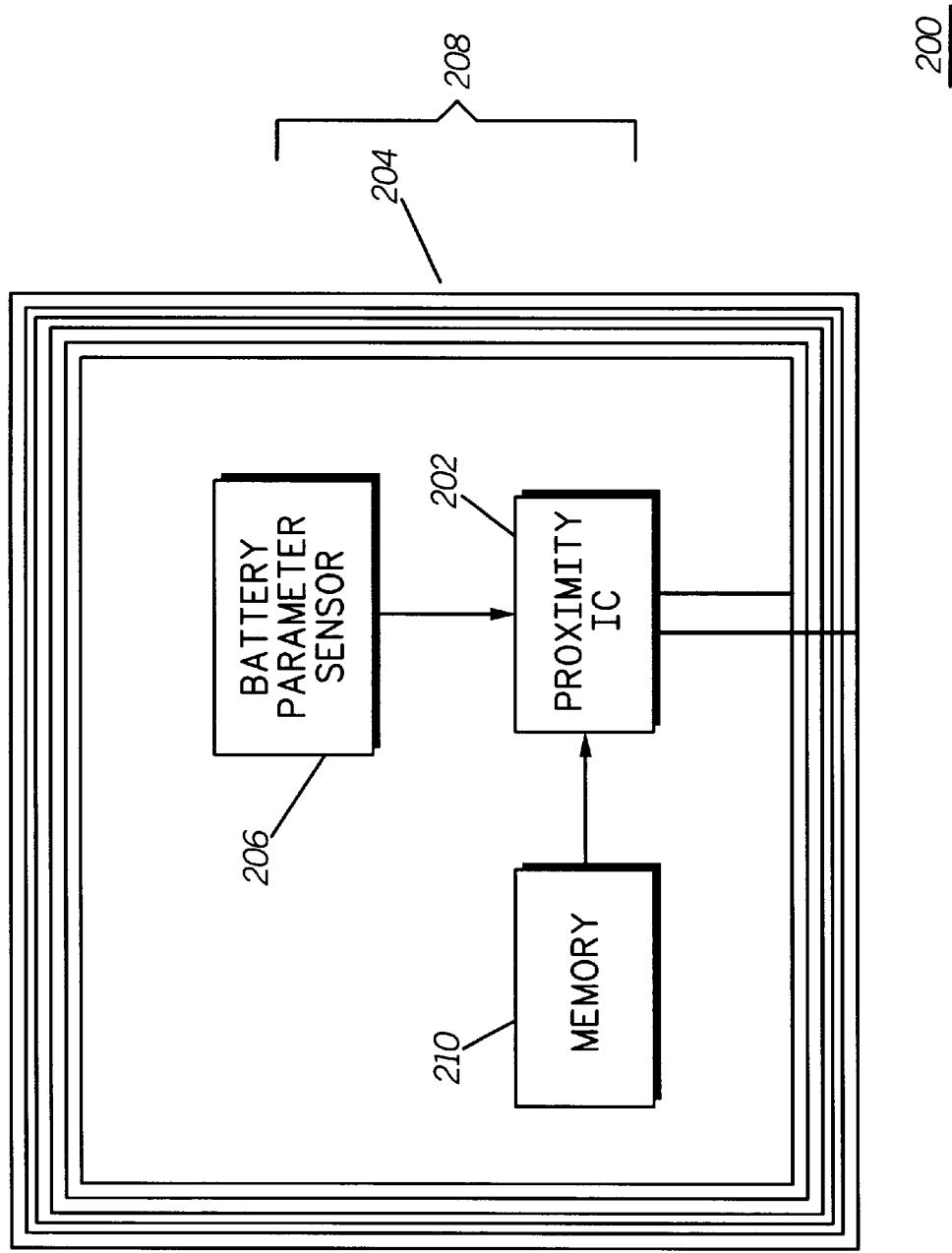
FIG. 2 is a battery parameter sensing apparatus in accordance with the present invention.

Referring now to FIG. 2, there is shown a battery parameter sensing apparatus 200 in accordance with the present invention. In accordance with the invention, the apparatus 200 includes a proximity integrated circuit (IC) 202, coil 204, and battery parameter sensor 206. The proximity IC 202 and coil 204 coupled thereto will generally be referred to as a proximity sensor 208 as known in the art. The proximity sensor 208 includes a memory portion 210 having stored battery information, such as chemistry type and rated capacity and possibly other recharge related information. Though shown externally, the memory portion 210 can alternatively be located internal to the proximity IC 202. In accordance with the invention, battery parameter sensor 206 can be a variety of sensor devices including, but not limited to, thermocouples or thermisters for monitoring temperature, voltage sensors for monitoring voltage, and/or pressure sensors for monitoring pressure.

The proximity sensor 208 preferably operates in the same manner as the communications module 28 and memory 30 of the incorporated reference. The coil 204 is responsive to an external magnetic flux source brought within close range of the coil. Once the coil 204 starts to resonate, the proximity IC 202 is activated and powers the memory device 210 and other logic circuits internal to the proximity IC. In accordance with the present invention, the proximity sensor 208 (upon activation) dynamically reads battery cell parameters, such as temperature, voltage, and pressure, through battery parameter sensor(s) 206. This battery parameter information can now be transferred back over a wireless link to the external source.

Figure 3:
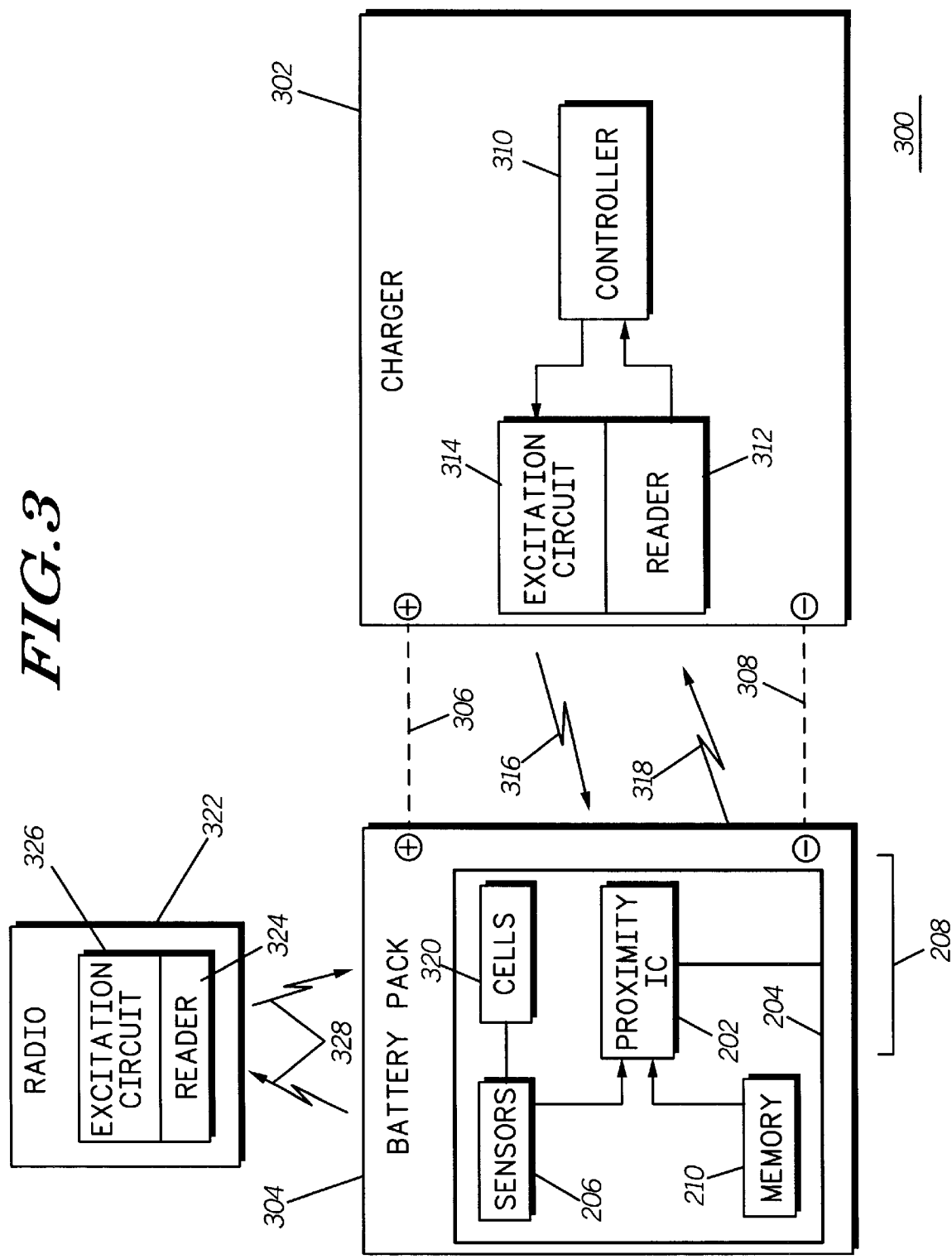
FIG. 3 is a first embodiment of a charging system incorporating the battery parameter sensing apparatus of FIG. 2.

FIG. 3 is a first embodiment of a charging system incorporating the battery parameter sensing apparatus of FIG. 2. In accordance with the first embodiment, the battery charging system 300 provides contactless dynamic monitoring and charging of a rechargeable battery pack 304. In this embodiment, the battery pack 304 includes at least one battery cell 320. In accordance with the invention, the proximity sensor 208, including proximity IC 202 and coil 204, is coupled to the battery pack 304 while at least one sensor 206 is coupled to at least one of the cells 320 and the proximity IC 202. The proximity sensor 208 preferably operates in the same manner as the wireless battery communications module 28 of the incorporated reference. The addition of the battery parameter sensors 206 to the proximity IC 202, however, provide for dynamic battery parameter measurement. Now dynamic battery parameters such as temperature, pressure, and voltage can be monitored and transferred back to the charger in addition to any static battery data downloaded from memory 210. Positive and negative charging contacts 306, 308 (shown in phantom) have preferably been eliminated through the use of inductive charging. Alternatively, positive and negative charge terminals 306 and 308 could also be used, if desired, while still allowing dynamic battery parameters such as temperature, pressure, and voltage to be monitored through the wireless configuration.

Charger 302 includes a micro-controller 310, a reader 312, and an excitation circuit 314 which preferably operate in the same manner as the wireless charger communications module 24 described by the incorporated patent. The charger's excitation circuit 314 preferably transmits a resonant frequency continuously, however, the transmission can also occur under some form of external control, such as a button press on the charger. The charger's excitation circuit 314 generates a magnetic flux 316 evident from outside the charger. When the battery 304 is brought within a predetermined distance of the charger 302, the magnetic flux signal 316 stimulates the battery coil 204 which in turn activates the proximity IC 202 to read the battery parameters through the battery sensors 206 as well as those held in memory 210.

In order for the charger 302 to receive the battery parameter information monitored in the battery pack 304, the reader circuit 312 is provided with an internal tank circuit (described in the incorporated reference) having the same resonant frequency as the excitation circuit 314 and the battery pack proximity sensor 208. Mutual induction is established between the two coils when brought in close proximity to each other with the modulation providing for a transfer of information.

In accordance with the present invention, a controller 310 of battery charger 302 utilizes the transferred dynamic battery parameter measurements as well as any transferred stored battery information to determine its charging process. The advantage provided by the charging system 300 of the first embodiment is the ability to take dynamic battery parameter measurements while minimizing the use of contacts and their associated alignment issues.

The charger controller 310 can, for example, read the dynamic temperature measurement and use it to select or adapt a charging process or charging routine. The charger 302 can use the temperature measurement for selecting a routine, such as a delta-T charge termination which indicates when the charge is complete so that the charger switches from rapid charge to trickle charge. The temperature slope characteristic known as $\Delta T/\Delta t$ measures the rise in battery temperature over time during the charge sequence and causes the charger to switch from rapid charge to trickle charge once a threshold change in temperature slope is detected. Thus, a rise in battery temperature determines when the battery is fully charged. The battery temperature measurement scheme of the present invention thus lends itself well to existing charge routines but with the added advantage of being contactless.

Memory 210 can also be written to, if desired, in order to capture such characteristics as cycle life which can then be displayed on a radio 322. The transfer of information to the radio 322 can also be achieved through a wireless link 328 by including another excitation circuit 326 and reader 324 within the radio 322 to communicate with the proximity sensor 208. The charger 302 may also be a vehicular adapter to provide battery charging in a vehicular environment.

Figure 4:
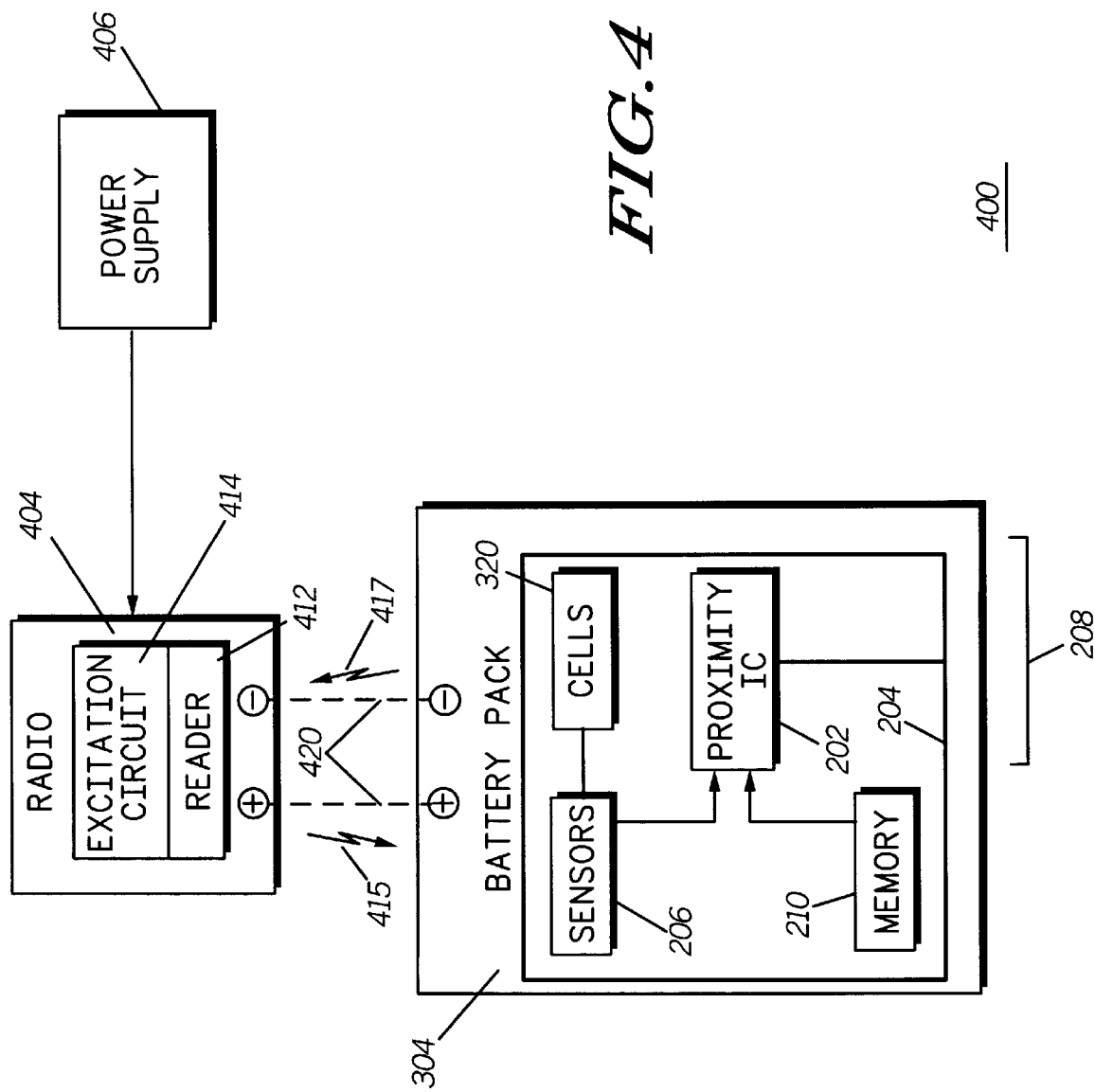
FIG. 4 is a second embodiment of a charging system incorporating the battery parameter sensing apparatus of FIG. 2.

FIG. 4 is a second embodiment of a charging system incorporating the battery parameter sensing apparatus of FIG. 2. Charging system 400 includes a battery pack 304, a radio 404, and a power supply 406. In this second embodiment the battery pack 304 is being charged through the radio 404 via a power supply 406.

Again the battery pack 304 includes coil 204, and proximity IC 202 forming the proximity sensor 208, and further includes at least one battery parameter sensor 206 coupled thereto for measuring such cell parameters as battery temperature, pressure, and voltage, in accordance with the invention. The battery pack 304 includes positive and negative battery-to-radio interface terminals 420 to provide energy to the radio during operation. By minimizing the overall number of contacts down to one set of positive and negative terminals, the contacts can be located on one plane which greatly simplifies accessory designs, such as vehicular adapters.

In accordance with the second embodiment of the invention, the radio 404 includes a reader 412 and an excitation circuit 414 to transmit a magnetic flux signal 415 to which the battery's proximity sensor 208 responds when the battery comes into close proximity of the radio. Once the wireless link is established between the proximity sensor 208, excitation circuit 414, and reader 412, the battery parameter measurements and any other battery information stored in memory 210 are transmitted to the radio 404 through flux signal 417. The radio's internal controller (not shown) utilizes the dynamically measured battery parameters, such as pressure, temperature, and battery voltage, as well as any other stored battery information to provide optimized charging capability. The power supply 406 provides charge current to the battery pack 304 through interface 420 via the radio 404.

This second embodiment is particularly useful in radios containing rechargeable battery cells that are not easily removable or are permanently a part of the radio system itself. A more ruggedized radio can be achieved by not having to design a removable battery pack and fewer contacts can be used thus minimizing alignment problems and reducing cost.

The embodiment of FIG. 4 also applies to batteries that can be separated from the radio. When battery pack 304 is removed from the radio 404, the battery pack can be charged from a charger, such as the charger 302 described in FIG. 3. In this charging configuration, the charger 302 would again include excitation circuit 314 and reader 312 to establish a wireless link with the battery's proximity sensor 208 to provide a contactless battery parameter interface between the battery pack 304 and charger 302 such that the charger dynamically monitors the battery parameter information and adaptively adjusts the internal charge process in response thereto. Thus, the battery pack 304 of the present invention can be can be recharged through a variety of battery charging devices such as a charger or radio/power supply combination.

Accordingly, there has been provided a battery pack 304 and battery charging systems 300, 400 which provide contactless dynamic battery parameter sensing. By adding the battery parameter sensors 206 inside the battery pack 304 to monitor dynamic battery parameter measurements, data can now be transferred to a charger and/or radio through a wireless link. The dynamically measured battery parameter information allows the charger and/or radio to adapt a charging routine or charge process based on the battery measurements thus providing optimized charging with minimal use of interface contacts.

While the preferred embodiments of the invention have been illustrated and described, it will be clear that the invention is not so limited. Numerous modifications, changes, variations, substitutions and equivalents will occur to those skilled in the art without departing from the spirit and scope of the present invention as defined by the appended claims.

What is claimed is:

1. A battery charging system, comprising:
   a rechargeable battery including:
      a battery parameter sensor for measuring battery parameter information of the rechargeable battery; and
      a proximity sensor coupled to the battery parameter sensor;
   a battery charging device for recharging the rechargeable battery, including:
      a controller for storing a charging process;
      an excitation circuit for activating the proximity sensor; and
      a reader circuit for receiving the battery parameter information, the controller adaptively modifying its charging process in response to the battery parameter information.

2. A battery charging system as described in claim 1, wherein the charging process is stored in the controller of a radio.

3. A battery charging system as described in claim 1, wherein the charging process is stored in the controller of a charger.

4. A battery charging system as described in claim 1, wherein the rechargeable battery further comprises a memory portion for storing information relating to static information of the rechargeable battery.

5. A charging system, comprising:
   a battery charging device; and
   a battery pack, including:
      at least one battery cell;
      a proximity sensor; and
      at least one battery parameter sensor coupled to the at least one battery cell and the proximity sensor, the at least one battery parameter sensor dynamically sensing battery parameter information when the battery pack is proximally coupled to the charger.

6. A charging system as described in claim 5, wherein the at least one battery parameter sensor senses battery voltage.

7. A charging system as described in claim 5, wherein the at least one battery parameter sensor senses battery temperature.

8. A charging system as described in claim 5, wherein the at least one battery parameter sensor senses battery pressure.

9. A charging system as described in claim 5, wherein the at least one battery parameter sensor comprises a plurality of battery parameter sensors for sensing a plurality of dynamic battery parameters.

10. A battery charging system, comprising:
    a battery pack and a charger:
       the battery pack including:
          at least one battery cell;
          a proximity IC;
          a coil coupled to the proximity IC; and
          a battery parameter sensor coupled to the at least one battery cell and the proximity IC for measuring battery parameter information;
       the charger including:
          an excitation circuit for transmitting a signal to modulate the battery coil and activate the proximity IC when the battery coil comes within a predetermined distance of the charger, the battery parameter sensor measuring the battery parameter information upon activation of the proximity IC, and the battery coil transmitting the battery parameter information back to the charger; and
          a reader circuit for receiving the battery parameter information, the charger adapting a charging process in response to variations in the battery parameter information.

11. A battery charging system, comprising:
    a battery pack;
    at least one battery parameter sensor coupled to the battery pack;
    a proximity sensor coupled to the battery parameter sensor; and
    a charger, including:
       a controller; and
       a reader circuit coupled to the controller for establishing a wireless link to the proximity sensor of the battery pack when the battery pack comes within predetermined distance of the proximity sensor, and wherein the reader circuit, proximity sensor, and battery parameter sensor provide a contactless interface through which the charger dynamically monitors battery parameter information and adapts a charging routine in response thereto.

12. A battery charging system, comprising:
    a battery pack having at least one battery parameter sensor coupled thereto;
    a proximity sensor coupled to the battery parameter sensor and the battery pack;
    a radio coupled to the battery pack, the radio including:
       a controller having an internal charge routine;
       a reader circuit;
       an excitation circuit; and
       wherein the excitation circuit, reader circuit, and proximity sensor establish a wireless link between the battery pack and the radio to provide a contactless battery parameter interface through which the radio dynamically monitors the battery parameter information and adaptively adjusts the controller's internal charge routine in response thereto; and
    a power supply for charging the battery through the radio under the control of the radio's internal charge routine.

13. A battery charging system as described in claim 12, wherein the battery is not removable from the radio.

14. A battery charging system as described in claim 12, wherein the battery is removable from the radio.

15. A battery charging system as described in claim 14, wherein the battery is removable from the radio and the battery is charged through a charger, the charger comprising:

a controller having a battery charging process;

an excitation circuit;

a reader; and wherein the charger's excitation circuit and reader and the battery's proximity sensor establish a wireless link to provide a contactless battery parameter interface between the battery and charger such that the charger dynamically monitors the battery parameter information and adaptively adjusts the battery charging process in response thereto.

* * * * *